United States Patent [19]

Freeman et al.

[11] 3,739,194

[45] June 12, 1973

[54] STATIC BIPOLAR TO MOS INTERFACE CIRCUIT

[75] Inventors: John A. Freeman; David De Souza, both of Ottawa, Ontario, Canada

[73] Assignee: Microsystems International Limited, Montreal, Quebec, Canada

[22] Filed: Jan. 17, 1971

[21] Appl. No.: 218,493

[30] Foreign Application Priority Data

July 21, 1971 Canada.......................... 118, 764

Related U.S. Application Data

[63] Continuation-in-part of Ser. No. 176,150, Aug. 30, 1971, abandoned.

[52] U.S. Cl. ............... 307/214, 307/205, 307/296, 307/304, 307/251

[51] Int. Cl. .......................................... H03k 19/40

[58] Field of Search .................. 307/205, 250, 251, 307/254, 304, 214, 216, 296; 330/29, 35

[56] References Cited

UNITED STATES PATENTS

| | | | |
|---|---|---|---|
| 3,678,293 | 7/1972 | Popper | 307/214 |
| 3,541,354 | 11/1970 | Basham | 307/251 |
| 3,309,534 | 3/1967 | Yu et al. | 307/304 X |
| 3,388,338 | 6/1968 | Austin | 330/35 X |
| 3,140,408 | 7/1964 | May | 330/35 UX |
| 3,202,904 | 8/1965 | Madland | 307/254 X |
| 3,275,911 | 9/1966 | Onodera | 307/251 X |
| 3,388,266 | 6/1968 | Kjar | 307/235 X |
| 3,449,686 | 6/1969 | Bladen | 330/35 X |
| 3,480,873 | 11/1969 | Carter | 330/35 X |
| 3,501,648 | 3/1970 | Webb | 307/254 |
| 3,575,614 | 4/1971 | Polkinghorn | 330/35 X |

*Primary Examiner*—John S. Heyman
*Attorney*—L. Brooke Keneford

[57] ABSTRACT

The invention relates to a method of interfacing between bipolar and field effect devices utilized complementarily in logic circuits. The invention provides compatibility virtually at all times between the switching levels for the bipolar and field effect devices and accomplishes this by providing source bias to the field effect transistor deriving input from the bipolar device, thereby effectively raising the turn-on voltage of the field effect transistor.

4 Claims, 4 Drawing Figures

Patented June 12, 1973 3,739,194

INVENTORS
JOHN A. FREEMAN
DAVID DeSOUZA

BY L. Brooke Kaufard
PATENT AGENT

STATIC BIPOLAR TO MOS INTERFACE CIRCUIT

This application is a continuation-in-part of application Ser. No. 176,150 filed Aug. 30, 1971 now abandoned.

The invention relates to a method of interfacing between bipolar and field effect devices utilized complementarily in logic circuits.

MOS (metal oxide semiconductor) field effect devices and bipolar semiconductor devices used in integrated logic circuits operate at inherently different logic levels. Typically, the switching threshold for a P-channel silicon gate device is from −1.5 to −2.5 volts and for an N-channel device is from +0.4 to +1.0 volts. The threshold for bipolar devices is approximately that for N-channel devices. Clearly, there are serious incompatibilities, particularly where P-channel MOS-to-bipolar interfacing is concerned, and the conventional way of alleviating the problem is to connect the source voltage supply ($V_{ss}$) for the MOS system to the collector voltage supply ($V_{cc}$) of the bipolar system. However, whilst this solves the problem of incompatibility between the voltage supplies required, the condition can arise where the MOS input transistor driven by the bipolar system is permanently turned on by the lower switching voltage derived from the bipolar system under heavy load condition, thus producing error conditions in the system.

For N-channel devices, the polarity incompatibility clearly does not arise but since such devices may switch as low as +0.4 volts or even lower and the bipolar system may give out this voltage as a "1" level output plus another 400 millivolts of noise — a worst case condition can arise causing error in the system.

The present invention solves this interface problem by providing compatibility virtually at all times between the switching levels and also has the advantage that the required circuitry may be incorporated in a MOS integrated sub-system without extra fabrication steps and may therefore be used to significantly extend the versatility of such systems at little extra cost.

Therefore according to the present invention, there is provided in a ratio inverter circuit comprising a field effect transistor and a resistive element adapted for connection in series across a potential supply having first and second terminals at first and second potential levels, means for connecting the end of said resistive element remote from said transistor to said first terminal, means for connecting the gate electrode of said transistor to an input signal supply adapted to swing between first and second voltage, said first voltage level being of such magnitude as to turn said transistor hard on and said second voltage level being of such magnitude that the conductance of said transistor when said second voltage is applied at the gate electrode thereof is substantially less than with said first voltage applied thereto, and means for connecting the drain electrode of said transistor to means adapted to derive an output voltage therefrom, the improvement which comprises means adapted to provide a bias at the source electrode of said transistor adapted to modify the effective turn-on voltage of said transistor to a value such that the conductance of said transistor when said second input voltage is applied at the gate thereof is substantially zero, and said bias means connected in series between the source electrode of said transistor and means for connection to said second terminal of said potential supply.

In a preferred embodiment of the invention, said means adapted to provide bias to said first-named transistor comprises a second ratio inverter circuit comprising a second transistor and a second resistive element, means for connecting the end of said second resistive element remote from said second transistor to reference ground potential, and means for connecting the source electrode of said second transistor to the second terminal of said potential supply, the drain electrode of said second transistor being connected to the source electrode of said first transistor and the gate electrode of said second transistor being connected to the gate electrode of said first transistor, the conductance of said second transistor being high during application to the gate electrode thereof of said first voltage level input signal, whereby bias at the source electrode of said first transistor is at substantially the value of said second potential level of said power supply thereby permitting said first transistor to turn hard on during application to the gate electrode thereof of said first voltage level input signal, the conductance of said second transistor being relatively low during application to the gate electrode thereof of said second voltage level input signal, whereby significant bias is applied to the source electrode of said first transistor thereby modifying the effective turn-on potential of said first transistor to a value such that the conductance of said first transistor when said second input voltage is applied at the gate thereof is substantially zero, the resistive values of said second transistor and said second resistive element being such as to form a potential divider whereby the required bias potentials are applied to the source electrode of said first transistor as aforesaid.

The invention will now be described further with reference to the accompanying drawings in which.

Figure 1:
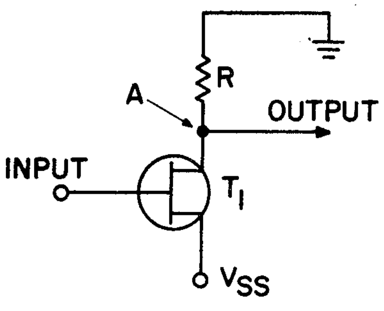
Fig. 1 (PRIOR ART)
FIG. 1 is a schematic diagram of a prior art MOS circuit for interface between bipolar and MOS systems.

Referring firstly to FIG. 1, there is shown a standard interfacing circuit for use in logic systems having bipolar systems and P-channel MOS sub-systems driven thereby. An input signal is applied to the gate of transistor $T_1$. The input signal will be at either of logic levels "0" or "1," logic level "0" representing the higher "turn-on" voltage level and logic level "1" representing the lower "turn-off" voltage for $T_1$. The source of transistor $T_1$ is connected to voltage supply ($V_{SS}$) ) and the drain of $T_1$ is connected through point A to resistor R which in turn is serially connected to reference ground potential. An output voltage is derived from point A. Assuming that the input to the gate of transistor $T_1$ is at logic level "0," $T_1$ is then turned on and since $T_1$ and R form a ratio inverter, the output at point A is at logic level "1."When the input switches to logic level "1," $T_1$ is disabled and the output at point A is at logic level "0." As explained above, ($V_{SS}$) ) is clamped to the same voltage as the collector voltage supply of the bipolar system from which the input to $T_1$ is derived, the collector voltage supply being +5.0 ± 0.25 volts. For conventional P-channel MOS circuitry ($V_{SS}$) ) would normally be at reference ground potential and the remote end of resistor R between −5.0 to 10.0 volts, depending on device characteristics. However by, maintaining the source of transistor $T_1$ at 5 volts above the remote end of resistor R, the ratio inverter constituted by these elements is operative but the switching levels for $T_1$ are correspondingly raised by 5 volts. This then brings the negative switching voltage normally required up to positive voltages of similar magnitude to those used for the bipolar system. Correspondence between the bipolar and conventional MOS levels may be seen from the following:

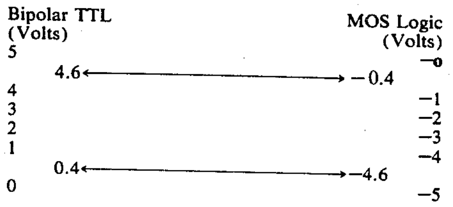

Since the switching level for the MOS device is between −1.5 and −2.5 volts, the swing between the MOS logic levels of −0.4 volts and −4.6 volts is amply wide to ensure proper switching of the transistor. However, the problem arises when there is heavy current draw on the bipolar circuit. In this condition, the output from the bipolar circuit does not swing to +4.6 volts and experience has shown that under worst case conditions, this voltage may be as low as +2.4 volts. Since this is the voltage to be applied to the MOS transistor $T_1$, it may be seen above that the corresponding MOS logic voltage level for this device is −2.6 volts. Thus, under worst case conditions, the equivalent MOS input voltage to $T_1$ swings between −4.6 volts and −2.6 volts, both of which are more negative than the normal switching level of between −1.5 and −2.5 volts for the MOS transistor, which means that $T_1$ is turned on at both bipolar logic levels "0" and "1." Clearly, error conditions in the system are caused by this reduced swing, since $T_1$ must be turned off when logic level "1" is applied thereto for the system to function properly. Further factors which tend to complicate the situation are inherent noise levels (typically in the order of 400 millivolts) and typical voltage supply variations, which, as mentioned above, are of the order of ± 0.25 volts.

Figure 2:
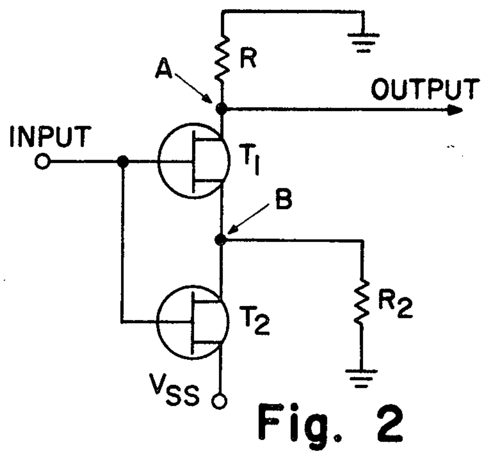
FIG. 2 is a schematic diagram of a circuit according to the present invention.

To allow for the worst-case type of situation described above, it it clearly desirable to raise the "turn-on" voltage of the transistor $T_1$ to a value more negative than the normal switching level for that transistor, and preferably to a mean value between the worst-case typical input levels of −4.6 and −2.6 volts. Taking approximately −3.5 volts as a good mean value, in the present invention, raising the "turn-on" voltage is achieved by utilizing the fact that increase in the source-bias on transistor $T_1$ raises the effective switching threshold of $T_1$ to a more negative volume. The invention utilizes this principle by applying a bias to the source of $T_1$ when the less negative input voltage of −2.6 volts is applied at the gate thereof. The manner in which this is achieved is shown in FIG. 2, from which it may be seen that a second ratio inverter constituted by transistor $T_2$ and resistor $R_2$ is inserted in the basic circuit of FIG. 1. The drain of $T_2$ is connected to the source of transistor $T_1$ and also to resistor $R_2$. The other end of resistor $R_2$ is connected to reference ground potential, the source of transistor $T_2$ is connected to source voltage $V_{SS}$ (+5.0 ± 0.25 volts) and the gate of $T_2$ is connected to the gate of $T_1$. Assuming an input to $T_1$ of −4.6 volts (logic level "0") $T_1$ is turned hard on. $T_2$ also turns hard on and effectively clamps point B to substantially same potential as $V_{SS}$. Thus the source-bias on $T_1$ is very small and $T_1$ remains hard on. Effectively therefore, in this condition, the circuit functions in the same manner as the prior circuit of FIG. 1. Consider now an input to $T_1$ of −2.6 volts (logic level "1" under worst case conditions), both transistors $T_1$ and $T_2$ are turned on but far less strongly than with the input signal of −4.6 volts. The ratio inverter constituted by $T_2$ and $R_2$ is adjusted so that a significant bias potential is applied to point B when $T_2$ is barely conducting, and this source-bias functions to raise the effective turn-on voltage of $T_1$ to a considerably more negative value than the second input level voltage of −2.6 volts and therefore $T_1$ turns off.

Figure 3:
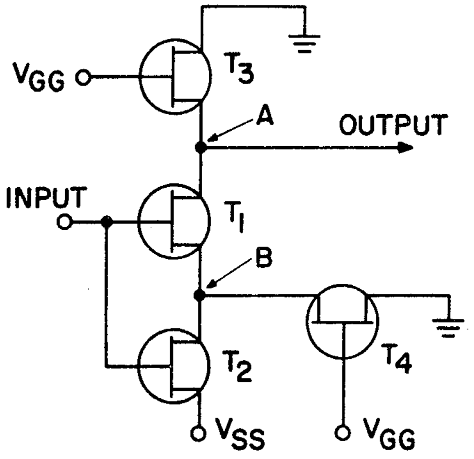
FIG. 3 is a schematic diagram of a circuit in a further embodiment of the invention.

Turning to FIG. 3, there is shown a further embodiment of the invention wherein resistors R and $R_2$ are replaced by transistors $T_3$ and $T_4$ respectively. With power supply and threshold voltages similar to those employed in the circuit of FIG. 2, the gate voltage ($V_{GG}$) for each of transistors $T_3$ and $T_4$ is −5 ± 0.25 volts. Practically, use of MOS transistors $T_3$ and $T_4$ as the resistive elements in place of diffused resistors substantially reduces the size of device required when the circuitry is realized on an integrated circuit chip. The functioning of the circuit of FIG. 3 is identical to that of FIG. 2 in that transistors $T_3$ and $T_4$ form the resistive elements of the ratio inverters constituted by $T_1$ and R and $T_2$ and $R_2$ respectively in the circuit of FIG. 2.

Figure 4:
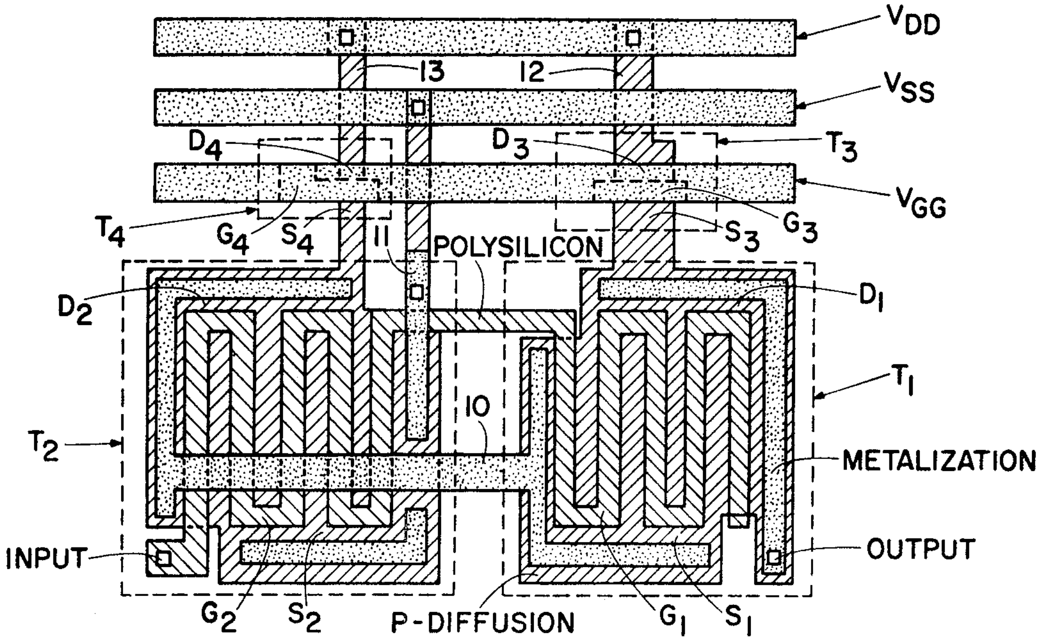
FIG. 4 is a plan of an integrated system incorporating the circuitry of FIG. 3.

FIG. 4 is a plan of an integrated system containing the circuit of FIG. 3. An input is applied to the polysilicon gate area of transistor $T_2$ and an output derived from the drain of transistor $T_1$. The gate regions $G_2$ and $G_1$ of these transistors are formed in a continuous meandering pattern. For each of the transistors $T_1$ and $T_2$, the gate regions are deposited over areas of P-diffused silicon, and drain and source regions $D_1$ and $S_1$ and $D_2$ and $S_2$ formed thereby. Metallization is deposited over the source and drain regions, and a strip 10 of such metallization connects drain region $D_2$ with source region $S_1$. The metallization over source region $S_2$ communicates with a second metallized strip 11 which in turn is connected via a strip of P-diffused silicon to a voltage supply strip at potential $V_{SS}$.

Transistors $T_3$ and $T_4$ are formed by strips 12 and 13 of P-diffused silicon extending between voltage supply strips at potential $V_{DD}$ and drain regions $D_1$ and $D_2$ respectively, such strips forming source and drain regions $S_3$ and $S_4$ and $D_3$ and $D_4$ of said transistors. Gate regions $G_3$ and $G_4$ are formed by deposition of polysilicon regions across the strips 12 and 13 and a metallization strip at potential $V_{GG}$ is deposited thereover and is in electrical contact with $G_3$ and $G_4$. Thus it will be seen that the circuit of FIG. 3 can readily and compactly be formed as an integrated circuit chip with no extra fabrication steps than would be required with conventional prior art devices.

Whilst the invention has been specifically described with relation to P-channel MOS to bipolar interface circuits, as previously stated, the invention is equally useful for interfacing between N-channel MOS and bipolar devices. However, in this case, $V_{SS}$ is at reference ground potential — as would normally be the case with MOS logic — and the drain supply voltage for transistor $T_3$ (see FIG. 3) would be positive and between +5.0 and +10.0 volts. With these N-channel field effect devices, for example metal gate devices, the drain supply voltage — whilst remaining positive — will vary with device characteristics and may be considerably lower than +5.0 volts.

It will be appreciated that the specific embodiment of the invention described herein and illustrated by the drawings are by way of example only and that various modifications and alternatives will be apparent to those skilled in the art without departing from the spirit and scope of the invention.

What is claimed is:

1. In a ratio inverter circuit comprising a first field effect transistor and a first resistive element connected in series between means for connection across a potential supply having first and second terminals at first and second potential levels, respectively, the end of said first resistive element remote from said first transistor being connected to said means for connection to said first terminal, the gate electrode of said first transistor being connected to means for connection to an input signal supply swinging between first and second voltage levels, said first voltage level being of such magnitude as to turn said first transistor hard on and said second voltage being of such magnitude that the conductance of said first transistor when said second voltage is applied at the gate electrode thereof is substantially less than with said first voltage applied thereto, and the drain electrode of said transistor being connected to means for connection to means for deriving an output potential therefrom, the improvement which comprises bias means for providing a bias at the source electrode of said first transistor when said second voltage level is applied at the gate electrode thereof which modifies the effective turn-on voltage of said transistor to a value such that the conductance of said transistor is substantially zero with said second voltage applied thereto and said bias means providing substantially a short-circuit between said source electrode of said first transistor and said means for connection to said second terminal of said potential supply when said first voltage level signal is applied at the gate electrode of said first transistor, said bias means comprising a second field-effect transistor connected between the source electrode of said first transistor and said means for connection to said second terminal means and also connected in series with a second resistive element to constitute a second ratio inverter circuit, the end of said second resistive element remote from said second transistor being connected to means for connection to a reference ground potential point, the source electrode of said second transistor being connected to said means for connection to said second terminal of said potential supply, the drain electrode of said second transistor being connected to the source electrode of said first transistor and to one end of said second resistive element, and the gate electrode of said second transistor being connected to the gate electrode of said first transistor, the conductance of said second transistor being high during application to the gate electrode thereof of said first voltage level input signal, whereby bias at the source electrode of said first transistor is at substantially the value of said second potential level of said power supply, thereby permitting said first transistor to turn hard on during application to the gate electrode thereof of said first voltage level input signal, the conductance of said second transistor being relatively low during application to the gate electrode thereof of said second voltage level input signal, whereby significant bias is applied to the source electrode of said first transistor thereby modifying the effective turn-on potential of said first transistor to a value such that the conductance of said first transistor when said second input voltage is applied at the gate thereof is substantially zero, the resistive values of said second transistor and said second resistive element being such as to form a potential divider whereby the required bias potentials are applied to the source electrode of said first transistor as aforesaid.

2. The circuit of claim 1 wherein:
said first resistive element comprises a third field effect transistor having its drain electrode connected to said means for connection to said first terminal, its gate electrode connected to gate voltage supply means, and its source electrode connected to the drain electrode of said first transistor;
said second resistive element comprises a fourth field effect transistor having its drain electrode connected to means for connection to a reference ground potential point, its gate electrode connected to gate voltage supply means, and its source electrode connected to the drain electrode of said second transistor;
said second terminal is at positive potential with respect to said first terminal; and
said first and second transistors are of P-channel type.

3. The circuit of claim 1 wherein:
said first terminal is at reference ground potential and said second terminal is positive with respect thereto;
said first and second transistors are of P-channel type; and
said input signal to said first transistor swings between first and second voltages which are positive with respect to said reference ground potential and negative with respect to the potential of said second terminal, said first voltage level being sufficiently negative with respect to said second terminal potential to turn said first transistor hard on and said second voltage level being less negative than said second terminal potential.

4. The ratio inverter circuit of claim 3 wherein said first and second resistive elements respectively comprise third and fourth transistors, each having drain, source and gate electrodes;
the drain electrode of said third transistor connected to said means for connection to said first terminal, the gate electrode of said third transistor being connected to means for connection to gate potential supply means and the source electrode of said third transistor being connected to the drain electrode of said first transistor; and
the drain electrode of said fourth transistor being connected to means for connection to a reference ground potential point, the gate electrode of said fourth transistor being connected to means for connection to gate potential supply means and the source electrode of said fourth transistor being connected to the drain electrode of said second transistor.

* * * * *